United States Patent [19]
Ott

[11] Patent Number: 4,613,829
[45] Date of Patent: Sep. 23, 1986

[54] SWITCHABLE OSCILLATOR CIRCUIT

[75] Inventor: Russell G. Ott, Cranford Township, Union County, N.J.

[73] Assignee: RCA Corporation, Princeton, N.J.

[21] Appl. No.: 793,237

[22] Filed: Oct. 31, 1985

[51] Int. Cl.[4] .............................................. H03B 5/00
[52] U.S. Cl. .................................. 331/59; 331/108 R; 331/116 FE; 331/117 FE; 331/158; 331/167
[58] Field of Search ...................... 331/59, 108 R, 111, 331/116 R, 116 FE, 117 R, 117 FE, 143, 153, 158, 167

[56] References Cited

U.S. PATENT DOCUMENTS

| | | | |
|---|---|---|---|
| 4,196,404 | 4/1980 | Ebihara | 331/116 FE |
| 4,282,496 | 8/1981 | Heuner | 331/158 X |
| 4,307,354 | 12/1981 | Miyagawa et al. | 331/116 FE |
| 4,370,625 | 1/1983 | Someshwar | 331/59 X |

Primary Examiner—Eugene R. LaRoche
Assistant Examiner—Robert J. Pascal
Attorney, Agent, or Firm—Joseph S. Tripoli; Henry I. Schanzer

[57] ABSTRACT

An oscillator circuit operable in different modes. The oscillator circuit, when operated as a crystal oscillator, is initially operated as a standard inverter oscillator requiring a low start-up voltage. Once the circuit oscillates, an hysteresis feedback network is inserted in the amplifying section of the oscillator providing a clock signal with sharper leading and falling edges. The circuit thus enables the start up of the oscillator at low voltages and ensures greater noise immunity following start-up. The oscillator circuit, when operated as an RC oscillator, may be operated as a Schmitt-trigger oscillator as soon as the oscillator is turned-on.

8 Claims, 4 Drawing Figures

SWITCHABLE OSCILLATOR CIRCUIT

FIELD OF THE INVENTION

This invention relates to oscillator circuits and, in particular, to oscillator circuits which may be operated in different modes.

BACKGROUND OF THE INVENTION

In many applications, it is desirable and/or necessary that a "basic" circuit be capable of being switched from one mode of operation to another. For example, it is desirable that the basic amplifying section of a circuit formed on an integrated circuit, such as a microprocessor chip, be operable either as an astable multivibrator oscillator, when connected to an RC network, or as an LC, RLC, crystal or tuning fork oscillator, when connected to an LC or RLC network or a crystal or tuning fork (typically located off-chip).

A problem exists in that certain circuit requirements needed to provide good and stable operation of the oscillator circuit are inconsistent with other requirements of the circuit. For example, in the amplifying section of a crystal oscillator circuit operated at frequencies below 30–40 KHz, the rise and fall times of the clock signal transitions are relatively slow. The slow rise and fall times cause the various amplifying stages (e.g. inverters) within the amplifying section of the oscillator circuit to be operated in their high gain region for a relatively long portion of each cycle. As a result, there is a greater likelihood of noise spikes and switching transients being amplified and causing disturbances of the clocking signal. Also, the slow rise and fall times cause a relatively high power dissipation. The rising and falling edges of the signal may be sharpened by using a positive (regenerative) feedback network within the amplifying section such that the amplifying section as a whole or certain stages within the amplifying section exhibit hysteresis, or Schmitt-trigger type action. The switching point of a stage exhibiting hysteresis (Schmitt-trigger action) depends on whether the input signal to the stage is increasing or decreasing and, typically, is significantly higher in one direction and lower in the other than the midpoint of the power supply voltage. However, a higher power supply voltage must be applied to the amplifying section of a crystal oscillator circuit to initiate oscillation when the amplifying section includes Schmitt-trigger type circuitry. A "higher" power supply voltage is not always available, and, where available, it causes an increase in the power dissipation of the system, which is highly undesirable. However, as noted above, "hysteresis" is needed for proper operation.

Furthermore, hysteresis circuits are needed in astable multivibrator circuits. For example, where the frequency determining element is an RC type network, it is essential to have Schmitt-trigger type circuitry to control the frequency of oscillation.

Thus, a problem exists where the same basic oscillator amplifying circuit is intended to be interconnected with crystals designed to oscillate at frequencies ranging from less than 30 to 40 KHz to more than 2 to 3 MHz. The problem is further aggravated where the same amplifying circuit is to be used to form an oscillator with elements such as a tuning fork or an RC, LC or RLC type network.

SUMMARY OF THE INVENTION

This problem is overcome in circuits embodying the invention by providing means for selectively enabling the insertion of an hysteresis producing regenerative feedback circuit within the amplifying section of an oscillator circuit. Typically, in a crystal oscillator circuit embodying the invention, the amplifying section is initially operated without hysteresis. Once the circuit oscillates, a selectively enabled hysteresis producing feedback network coupled to the amplifying section is enabled.

BRIEF DESCRIPTION OF THE DRAWINGS

In the accompanying drawing, like reference characters denote like components.

DETAILED DESCRIPTION

Figure 1:
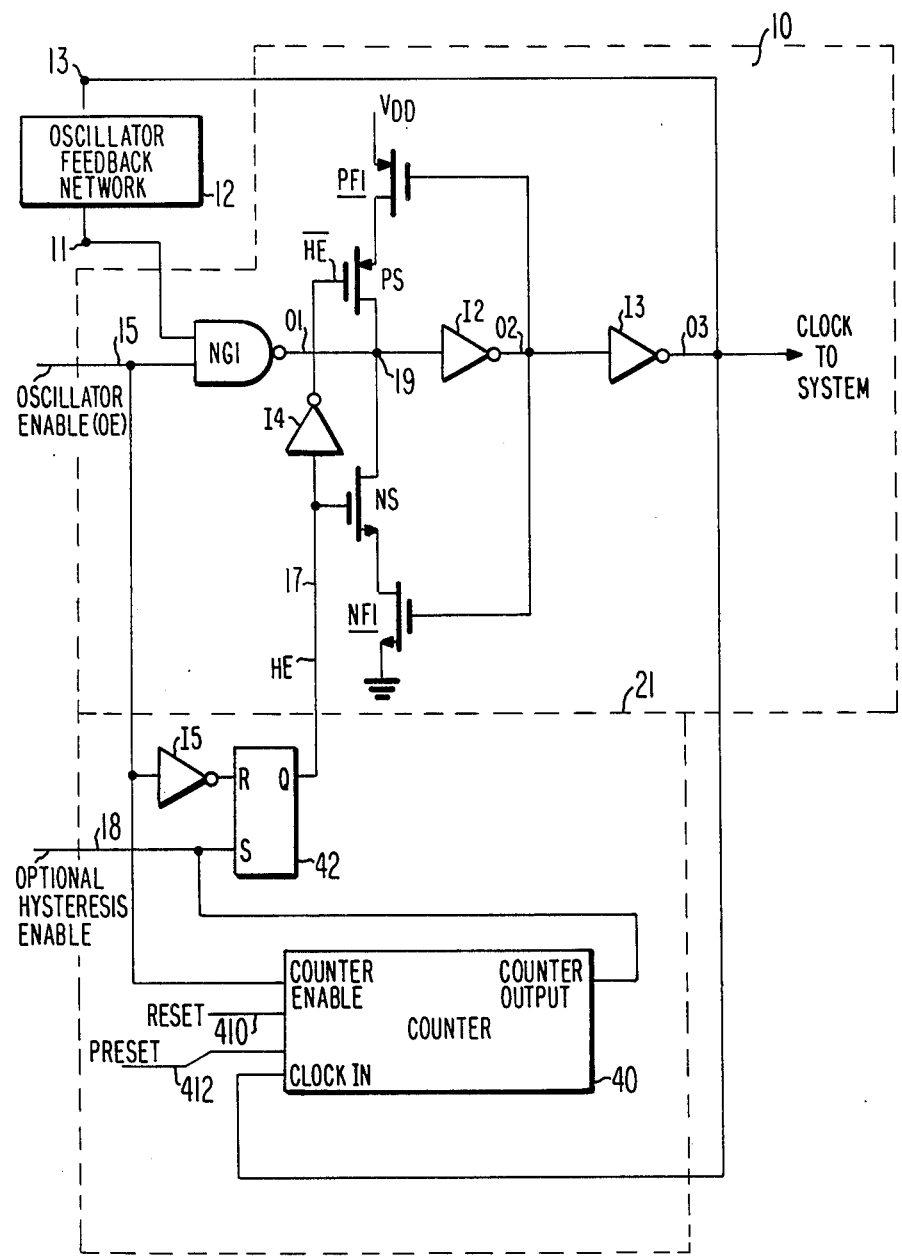
FIG. 1 is a partial schematic, partial block diagram of a circuit embodying the invention.
Figure 2A:
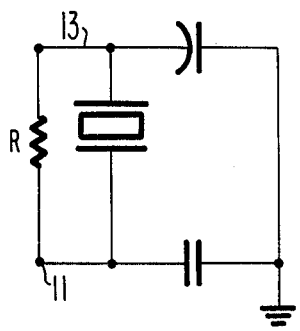
FIGS. 2A, 2B and 2C are schematic diagrams showing the interconnection of various oscillator feedback networks suitable for use with the circuit of FIG. 1.
Figure 2B:
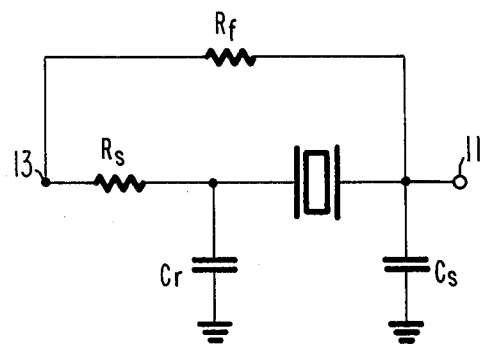
Figure 2C:
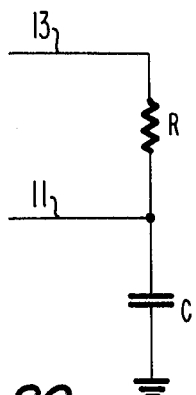

The oscillator of FIG. 1 includes an amplifying section 10 connected at its signal input to oscillator terminal 11 and at its signal output to oscillator terminal 13 and an oscillator feedback network 12 connected between terminals 11 and 13. The oscillator feedback network 12 may be a crystal, a tuning fork, or any number of RC, LC or RLC type networks. Typically, the oscillator feedback network 12 may be: (a) a crystal directly connected between terminals 11 and 13, as shown in FIG. 2A; or (b) a crystal pi-type network connected between terminals 11 and 13 as shown in FIG. 2B; or (c) an RC network connected between terminals 11 and 13 as shown in FIG. 2C. The crystal and RC networks are shown by way of illustration only and it should be understood that any number of known oscillator feedback networks may be used, instead, in combination with the circuit of FIG. 1.

As is well known, for oscillation to occur, the gain ($\alpha$) of amplifying section, 10, times the attenuation ($\beta$) of the oscillator feedback network, 12, must be greater than unity (i.e., $\alpha\beta > 1$). In addition, the total phase shift through the amplifier, 10, and feedback network, 12, must be equal to n times 360 degrees, where n is an integer. These conditions imply that oscillations occur in any system in which an amplified signal is returned in phase to the amplifier input after being attenuated less than it was originally amplified. In such a system, any noise present at the amplifier input causes oscillation to build up at a rate determined by the loop gain (or $\alpha\beta$ product) of the overall circuit.

Oscillator input terminal 11 and a terminal 15 to which is applied an oscillator enabling signal (OE) are connected to the two (2) inputs of a two-input NAND gate (NG1) which may be a complementary symmetry metal-oxide semiconductor (CMOS) device such as the CD74HC00 manufactured by RCA Corp. The output 01 of NG1 is connected to the input of an inverter I2. The output 02 of inverter I2 is connected to the input of an inverter I3. The output 03 of inverter I3 is connected to oscillator terminal 13. Inverters I2 and I3 may be any one of a number of known inverters. By way of example, inverters I2 and I3 may be complementary inverters such as the CD74HC04, manufactured by RCA, Corp.

A selectively enabled "hysteresis" causing feedback network is coupled between the input and output of inverter I2. The "hysteresis" feedback network (to differentiate it from the oscillator feedback network) includes feedback transistors PF1 and NF1 having their gate electrodes connected to the output (02) of inverter I2. PF1 and NF1 are preferably insulated-gate field-effect transistors (IGFETs) with the prefix "P" indicating the transistor PF1 to be of P-conductivity type, and the prefix "N" indicating the transistor NF1 to be of N-conductivity type. The conduction path of PF1 is connected in series with the conduction path of a selectively enabled switching transistor PS between $V_{DD}$ and node 19, which is connected to the output (O1) of NAND gate NG1 and to the input of inverter I2. The conduction path of NF1 is connected in series with the conduction path of a selectively enabled switching transistor NS between node 19 and ground. A conductor 17 to which is applied a hysteresis enable signal (HE) is connected to the gate electrode of NS and to the input of an inverter I4 whose output 04 is connected to the gate electrode of IGFET PS.

Consequently, transistors NS and PS are turned on at the same time and turned off at the same time. When the hysteresis enable signal (HE) is high, the output $\overline{HE}$ of inverter I4 is low and transistors NS and PS are turned-on. The conduction paths of PF1 and NF1 are then connected via the relatively low impedance conduction paths of PS and NS, respectively, to node 19. With PS and NS turned-on, PF1 and NF1 in combination with I2 form a flip-flop type circuit which in operation exhibits hysteresis, demonstrated as follows. Normally, the output of I2 will be either driven to, or close to, ground (i.e. low or logic "0") or to, or close to, $V_{DD}$ volts (i.e. high or logic "1"). When the output of I2 is low, PF1 is turned-on and NF1 is turned-off. With PF1 turned-on, the input of I2 is pulled towards $V_{DD}$ via the ON impedance ($Z_{ON}$) of PF1. Also, with PF1 turned-on, the effective "ON" impedance between $V_{DD}$ and the output 01 of NG1 is decreased and is lower than the effective "ON" impedance between the output 01 of NG1 and ground. Consequently, the signal being developed at node 11 (i.e., the input of NG1) must go significantly above, $V_{DD}/2$ to cause the output of NG1 (i.e. the input of I2) to be pulled down to $V_{DD}/2$ to, in turn, cause the output of I2 to switch from low to high. By way of example, the "low" to "high" input trigger (or switching) point may be assumed to be equal to 3.5 volts. That is, when node 11 goes above 3.5 volts, the output of NG1 switches from high-to-low and the output of I2 switches from low-to-high. Once the switching point of the "Schmitt-trigger" type circuit is reached, the output changes state very quickly due to the regenerative feedback within the I2/PF1 loop. When the output of I2 is high, PF1 is turned-off and NF1 is turned-on. The "ON" impedance of NF1 is then connected between the output 01 of NG1 and ground, causing the effective impedance between 01 and ground to be lower than the effective impedance between 01 and $V_{DD}$. Consequently, with NF1 turned-on and pulling node 19 towards ground, the signal applied to node 11 (i.e. the input of NG1) must fall significantly below $V_{DD}/2$ to cause the output of I1 to switch from low-to-high and the output of I2 to switch from high-to-low. By way of example, the high-to-low input trigger (switching) at node 11 may be assumed equal to 1.5 volts to cause the output of I1 to go from low-to-high and the output of I2 to go from high-to-low.

When HE is low, $\overline{HE}$ is high and transistors NS and PS are turned-off. The "hysteresis" feedback network is then disabled with PF1 and NF1 being effectively disconnected from the circuit. As shown in FIG. 1, by connecting PS and NS between node 19 and the conduction paths of PF1 and NF1, respectively, their capacitance is decoupled from node 19, when PS and NS are turned-off. (However, PF1 and PS may be interchanged and NF1 and NS may be interchanged.)

A delay network 21 which derives its clock input from terminal O3 is connected between terminals 13 and 15 and conductor 17. Delay network 21 includes a counter 40 and a set/reset flip-flop 42. The oscillator output 03 of inverter I3 is applied to the clock-input of counter 40. Counter 40 is of the type which may be reset via a reset input 410. Also, counter 40 may be preset to any count intermediate zero and an all "ones" condition by means of a preset input 412. The counter output is connected to the set (S) input of set/reset flip-flop 42, the Q output of flip-flop 42 is applied to conductor 17 and functions to enable or disable the application of the hysteresis producing network to inverter I2; (that is, Q-high is enabling and Q-low is disabling.) The oscillator enable (OE) signal on line 15 is applied to the counter enable input of counter 40, via an inverter I5 to the reset (R) input of flip-flop 42, and to one input of NG1. An optional hysteresis enable line 18 is connected to the set input of flip-flop 42.

The circuit of FIG. 1 may be operated in different modes depending, for example, on whether a crystal is connected between terminals 11 and 13 or an RC network is connected therebetween.

For the case where a crystal is connected between terminals 11 and 13, counter 40 is initially reset to an all "zero" condition. Assume, for example, that counter 40 is a 3-bit counter with a full count of seven; (i.e. it overflows when, after being reset, an eighth input pulse is applied to its input). When the oscillator enable (OE) signal is initially enabled (i.e. goes from low-to-high): a) NAND gate NG1 is enabled and functions as an inverter to the signals at oscillator terminal 11; and b) the high reset level is removed from flip-flop 42, enabling flip-flop 42 to be eventually set to a Q-high condition when the set input goes high. However, initially, the Q output of flip-flop 42 remains low whereby HE remains low and the hysteresis network remains disabled; i.e. PS and NS are turned-off and PF1 and NF1 are effectively disconnected from the circuit.

When OE is high, NG1 which functions as an inverter, is connected in cascade with inverters I2 and I3 between oscillator terminals 11 and 13. As discussed above, the gain of the amplifying sections (NG1, I2 and I3) is sufficient to ensure oscillation when a crystal is connected between terminals 11 and 13. A crystal oscillator depends on amplification of noise in order to start oscillating. When the oscillator amplifying section 10 is operated without the hysteresis feedback network (i.e. it is disabled), the inverters are biased at their mid-point in their high gain region. Any noise causes oscillation to start and to build up without impediment, providing the loop gain is greater than one. If the hysteresis feedback network is enabled and therefore present when the oscillator is first turned-on and before oscillations begin, the circuit cannot oscillate until and unless the amplitude of the "crystal oscillations" exceed the hysteresis induced trigger level voltages (switching points). By way of example, the start-up voltage (i.e. the supply voltage needed to cause the oscillator circuit to exhibit sustained oscillations) of the circuit of FIG. 1 connected with a crystal and functioning as a crystal oscillator was determined to be as follows: With the hysteresis network disabled, a supply voltage of 3 volts was required to obtain oscillations. With the hysteresis network being enabled when the oscillator circuit was enabled, a supply voltage of 3.8 volts was required to obtain oscillations.

Applicant recognized that once the oscillator, operated without hysteresis, is in full swing, the introduction of hysteresis does not alter the frequency or interrupt the oscillation. It only tends to sharpen the rising and falling edges and increase the noise immunity. Referring back to the circuit of FIG. 1, with the onset of oscillations, clock signals are produced at the output of inverter I3 and applied to the clock input of counter 40. As soon as seven pulses have been applied to the counter, the counter is full and on the next (eighth) pulse, a "high" signal is applied to the set input of flip-flop 42 causing its Q output to go high and the hysteresis network to be enabled. When Q goes high, HE goes high, turning-on PS and NS which connect PF1 and NF1 in circuit with I2. When that occurs, the rising and falling edges of the waveforms at the input and output of the inverters become significantly sharper, i.e. their transitions from high-to-low or low-to-high, take less time. This is especially so at low frequencies where the rise and fall times tend to be slow. Based on analysis and testing, it becomes evident that once the oscillator is fully functioning, the introduction of hysteresis does not upset the operation of the oscillator; that is, the oscillator continues to oscillate and at the rate determined and established by the crystal.

When a low frequency crystal is connected to terminals 11 and 13, the hysteresis or Schmitt-trigger action associated with inverter I2 ensures that the clock signal will have relatively sharp rising and falling edges, even at the low frequencies. The circuit of FIG. 1 thus enables the oscillator circuit to begin operation without hysteresis or Schmitt-trigger action and provides the means for applying the hysteresis feedback after the oscillator circuit is operating. In most applications, the first few oscillator cycles are rarely used since several cycles are normally needed for the circuit to stabilize. Hence the delay introduced by the circuit of FIG. 1 between oscillator enable and hysteresis enable should have little, if any, adverse effects while providing all the advantages discussed.

When, for example, an RC network is connected between terminals 11 and 13, instead of a crystal, counter 40 may be preset to an all "ones" condition. This ensures that as soon as the oscillator enable signal (OE) is applied, that PS and NS are turned-on and the hysteresis feedback network is applied across inverter I2 ensuring consistent operation as an RC oscillator in which the frequency of operation is controlled.

Alternatively to the use of a delay circuit such as the one shown in FIG. 1, means may be provided to the circuit of FIG. 1 to short circuit the delay network and have HE go high (i.e. enable condition) when OE goes high (i.e. enable condition) whenever an RC oscillator network is connected between terminals 11 and 13. This may be provided by circuitry (not shown) connected between terminal 15 and conductor 17, or by applying an optional hysteresis enable signal to line 18 also connected to the set-input of flip-flop 42.

The circuit of FIG. 1 may thus be operated to have the advantages of a Schmitt-trigger oscillator in addition to the advantages of a standard inverter oscillator.

When used as a crystal oscillator, the circuit of the invention is initially operated as a standard inverter oscillator requiring a low start-up voltage. Once oscillation occurs, the oscillator is switched to becoming a Schmitt-trigger oscillator with the inherent noise immunity associated with that type of circuitry. When the circuit is to be operated as an RC oscillator, the circuit is easily and readily rendered operable, initially, as a Schmitt-trigger oscillator.

What is claimed is:

1. An oscillator circuit comprising:
first and second oscillator terminals for the connection therebetween of different types of oscillator feedback networks;
selectively enabled amplifying means having an input connected to said first oscillator terminal and having an output connected to said second oscillator terminal;
selectively enabled hysteresis producing feedback means connected to said amplifying means for, when enabled, causing said amplifying means to exhibit hysteresis;
oscillator enabling means connected to said amplifying means for selectively enabling said amplifying means and causing oscillation within the circuit loop formed by said amplifying means and said oscillator feedback network; and
means responsive to said oscillator enabling means, coupled to said hysteresis producing feedback means, for delaying the enabling of said hysteresis producing feedback network, after said amplifying means is enabled, for a predetermined number of oscillations, depending on the type of oscillator feedback network connected between said oscillator terminals.

2. The combination as claimed in claim 1 wherein said amplifying means includes first, second and third inverting means, each one of said inverting means having a signal input terminal and a signal output terminal; and wherein the output terminal of the first inverting means is connected to the input terminal of the second inverting means, the output terminal of the second inverting means is connected to the input terminal of the third inverting means, the input terminal of said first inverting means is connected to said first oscillator terminal and the output of said third inverting means is connected to said second oscillator terminal.

3. The combination as claimed in claim 2 wherein said selectively enabled hysteresis producing feedback means is coupled between the input and the output of said second inverting means causing, when enabled, said second inverting means to exhibit hysteresis.

4. The combination as claimed in claim 3 wherein said selectively enabled hysteresis producing feedback means includes, first and second insulated-gate field-effect transistors (IGFETs) of complementary conductivity type, each IGFET having a control electrode and a conduction path, and wherein said IGFETs have their gate electrodes connected to the output terminal of said second inverting means, and wherein the conduction path of said first IGFET is connected via the conduction path of a first switching transistor between the input terminal of said second inverting means and a first point of operating potential and wherein the conduction path of said second IGFET is connected via the conduction path of a second switching transistor between the input terminal of said second inverting means and a second point of operating potential; and wherein said means coupled to said hysteresis producing feedback means includes means for concurrently turning-on said first and second switching transistors in order to connect said hysteresis producing feedback network in circuit with said second inverter.

5. The combination as claimed in claim 2 wherein said means responsive to said oscillator enabling means coupled to said hysteresis producing feedback means includes a counter having an input connected to one of the output terminals of said first, second and third inverting means and having an output coupled to said hysteresis producing feedback means.

6. The combination as claimed in claim 1 wherein said counter includes means for presetting it to any count between an all "zero" or an all "ones" condition.

7. The combination as claimed in claim 2 wherein said first inverting means is a two-input NAND gate, one input of said NAND gate being connected to said first oscillator terminal; and wherein said oscillator enabling means is coupled to the second input of said NAND gate.

8. Amplifying means for an oscillator circuit comprising:

first, second and third inverting means, each one of said inverting means having a signal input terminal and a signal output terminal;

means connecting the output terminal of the first inverting means to the input terminal of the second inverting means, and the output terminal of the second inverting means to the input terminal of the third inverting means;

means connecting the input terminal of said first inverting means to a first oscillator terminal and means connecting the output of said third inverting means to a second oscillator terminal; said first and second oscillator terminals being adapted for the connection therebetween of different types of oscillator feedback networks;

a selectively enabled hysteresis producing feedback means connected between the input and the output terminals of one of said first, second and third inverting means for, when enabled, causing said one of said inverting means to exhibit hysteresis; and means coupled between an output terminal of one of said inverting means and said hysteresis producing feedback means, responsive to the presence of a predetermined number of oscillations at said one output terminal for then enabling said hysteresis producing feedback means.

* * * * *